US012588150B2

(12) United States Patent
Pohl et al.

(10) Patent No.: US 12,588,150 B2
(45) Date of Patent: Mar. 24, 2026

(54) PACKAGE, METHOD FOR FORMING A PACKAGE, CHIP CARD, AND METHOD FOR FORMING A CHIP CARD

(71) Applicant: Infineon Technologies AG, Neubiberg (DE)

(72) Inventors: Jens Pohl, Bernhardswald (DE); Frank Püschner, Kelheim (DE)

(73) Assignee: Infineon Technologies AG, Neubiberg (DE)

( * ) Notice: Subject to any disclaimer, the term of this patent is extended or adjusted under 35 U.S.C. 154(b) by 647 days.

(21) Appl. No.: 18/062,164

(22) Filed: Dec. 6, 2022

(65) Prior Publication Data

US 2023/0187328 A1    Jun. 15, 2023

(30) Foreign Application Priority Data

Dec. 10, 2021    (DE) .......................... 102021132666.4

(51) Int. Cl.
*H05K 3/34*          (2006.01)
*G06K 19/077*     (2006.01)
(Continued)

(52) U.S. Cl.
CPC ..... *H05K 3/3431* (2013.01); *G06K 19/07722* (2013.01); *H05K 1/111* (2013.01);
(Continued)

(58) Field of Classification Search
None
See application file for complete search history.

(56) References Cited

U.S. PATENT DOCUMENTS 7,994,629 B2 *   8/2011   Camacho ................ H01L 24/49
                                                             257/691
10,163,766 B2 *  12/2018  Truhitte .............. H01L 21/4842
                         (Continued)

FOREIGN PATENT DOCUMENTS

DE        102018118337 A1      2/2019
DE        102020108927 A1      9/2021
                   (Continued)

OTHER PUBLICATIONS

Kumar et. al (WO 2014114003 A1) (Year: 2014).*
Bondarenko (WO 2015160359 A1) (Year: 2015).*
Kumar (WO-2014114003-A1) (Year: 2014).*

*Primary Examiner* — Allen L Parker
*Assistant Examiner* — Elisa Sasserath
(74) *Attorney, Agent, or Firm* — Banner & Witcoff, Ltd.

(57)          ABSTRACT
A package including an electronic leadless module having a top side, a bottom side and side faces between the top side and the bottom side, the electronic leadless module having an electronic circuit, a plurality of electrical contact pads at the bottom side of the electronic leadless module which are electrically conductively coupled to the electronic circuit, and encapsulation material which partially encapsulates the electronic circuit, wherein the electrical contact pads are at least partially free from encapsulation material and the electronic leadless module have an anchoring region on at least one side face. The package may also include a carrier frame which carries the electronic leadless module, with the side face extending further in the direction of the carrier frame below the anchoring region than in the anchoring region, and filler material in the anchoring region for fastening the electronic leadless module to the carrier frame.

20 Claims, 7 Drawing Sheets

(51) Int. Cl.
    *G06V 40/13*        (2022.01)
    *H05K 1/11*         (2006.01)
    *H05K 3/341*        (2026.01)

(52) U.S. Cl.
    CPC .... *G06V 40/13* (2022.01); *H05K 2201/09381*
          (2013.01); *H05K 2201/10727* (2013.01)

(56)                References Cited

U.S. PATENT DOCUMENTS

| | | | | |
|---|---|---|---|---|
| 2012/0168920 A1* | 7/2012 | Tan | ................... | H01L 23/49503 |
| | | | | 257/676 |
| 2021/0303813 A1* | 9/2021 | Pohl | ........................ | H04B 5/24 |

FOREIGN PATENT DOCUMENTS

| | | | | | |
|---|---|---|---|---|---|
| WO | WO-2014114003 A1 * | 7/2014 | ............. | H01L 24/82 |
| WO | WO-2015160359 A1 * | 10/2015 | ............. | H01L 24/17 |
| WO | 2020231053 A1 | 11/2020 | | |

* cited by examiner

Figure 6:
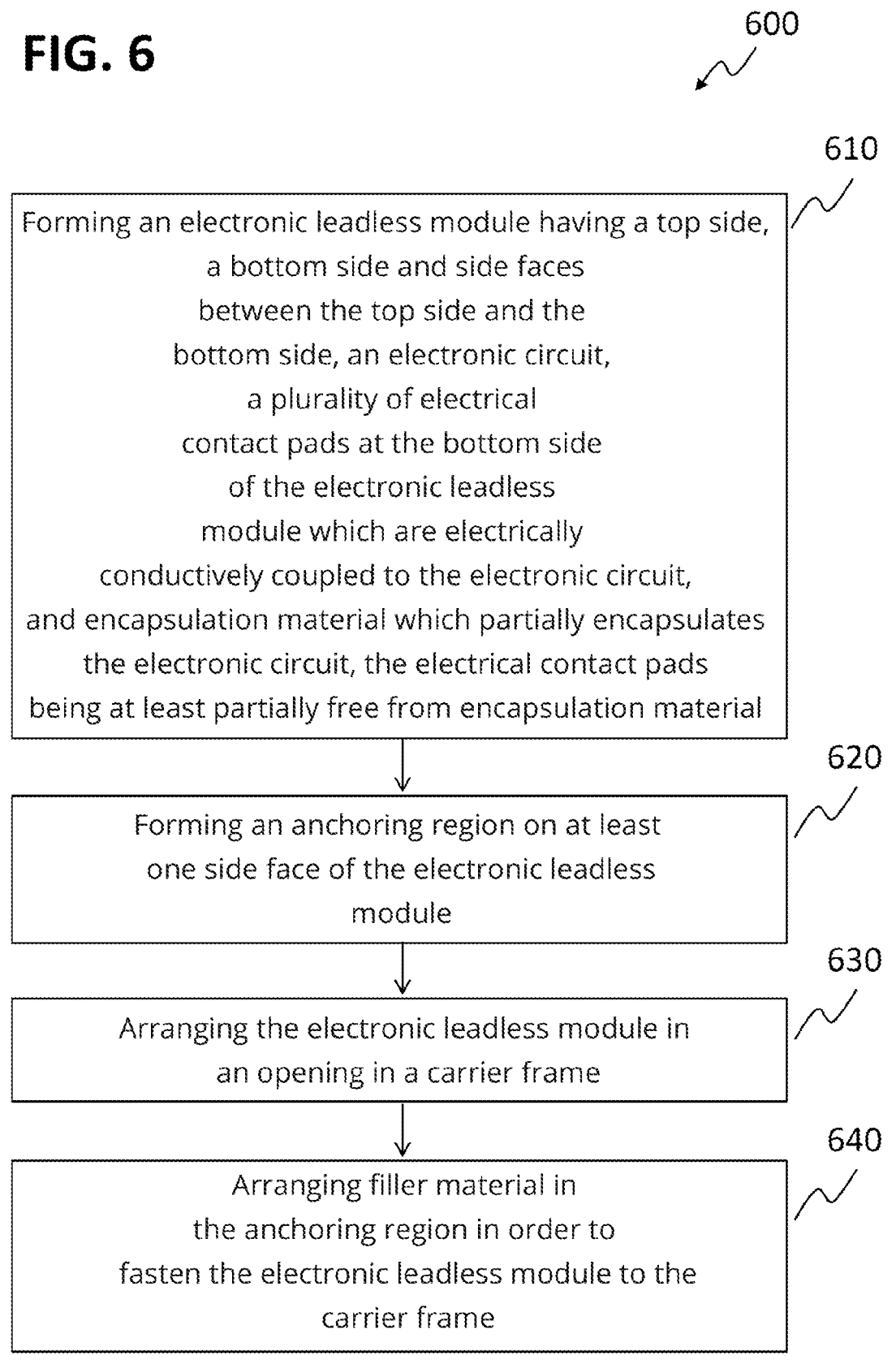

Forming an electronic leadless module having a top side,
a bottom side and side faces
between the top side and the
bottom side, an electronic circuit,
a plurality of electrical
contact pads at the bottom side
of the electronic leadless
module which are electrically
conductively coupled to the electronic circuit,
and encapsulation material which partially encapsulates
the electronic circuit, the electrical contact pads
being at least partially free from encapsulation material

620

Forming an anchoring region on at least
one side face of the electronic leadless
module

630

Arranging the electronic leadless module in
an opening in a carrier frame

640

Arranging filler material in
the anchoring region in order to
fasten the electronic leadless module to the
carrier frame

Figure 7:
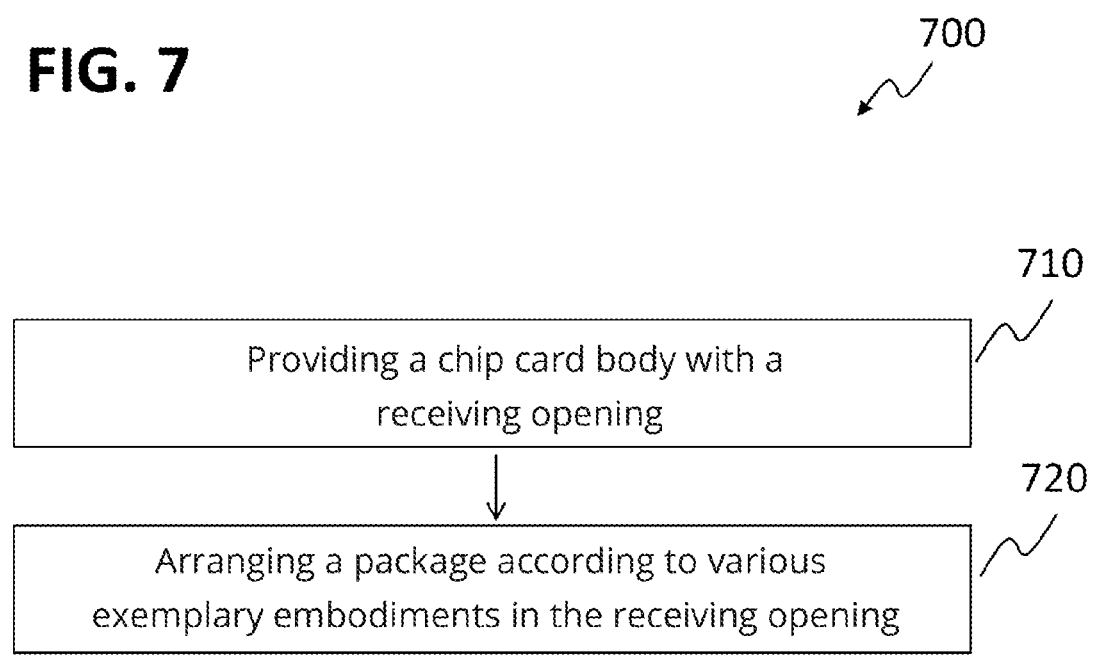

| Providing a chip card body with a receiving opening |
|---|

720

| Arranging a package according to various exemplary embodiments in the receiving opening |
|---|

PACKAGE, METHOD FOR FORMING A PACKAGE, CHIP CARD, AND METHOD FOR FORMING A CHIP CARD

TECHNICAL FIELD

The disclosure relates to a package, a method for forming a package, a chip card, and a method for forming a chip card.

BACKGROUND

According to the prior art, a mechanical robustness of a package 400 containing an electronic leadless module 300 (see FIG. 4A and the associated leadless module in FIG. 3A, for example) can be so low that damage, possibly even functional impairment, may arise during the further processing of the package and/or during operation.

Currently, such an electronic leadless module 300 is provided for example in the form of a sensor module, for example as a biometric sensor, for example a fingerprint sensor. In the process, the electronic leadless module 300 is typically arranged in an opening of a carrier tape 442 (also referred to as a module tape), and a gap between side walls of the carrier tape 442 and side walls of the leadless module 300 is sealed using a resin 224.

However, the gap is typically very narrow, and hence not all locations in the gap might be reached, for example especially in the case where the leadless module is not arranged completely centrally within the opening, and/or an adhesive effect of the resin in relation to the leadless module does not suffice to permanently fasten the module under load.

By way of example, the package with the leadless module may be embedded in a chip card, for example a chip card for banking applications. In such a case the package 400 may be exposed to bending loads for example, which may lead to cracks in the seal, a detachment of the seal or any other damage to the seal, and this may lead to failure in the field. Such a weakness may also become noticeable during a load test, by virtue of the package possibly failing standard load tests.

Further, a controlled output of the resin into the gap only may be difficult, and so it may occur that small amounts of resin are inadvertently output onto the sensor surface. This may impair a functionality of the sensor.

Hence, there is a need for a package having an electronic leadless module having a greater robustness and/or a simplified production, with a need in particular consisting in the ability to apply the simplified production during a production method in which the electronic leadless module is embedded in a carrier tape, for example within the scope of a roll-to-roll method.

SUMMARY

A package is provided in various exemplary aspects, the package comprising an electronic leadless module (leadless module or module for short), the side wall of which has been provided with an anchoring region (for example in the form of a cutout, for example as a step, chamfer or groove, or as an inclined side wall which is closer to a central region of the leadless module at the upper end than at the lower end). The anchoring region offers space for a filler material, in particular for a greater amount of the filler material than in the prior art.

Stronger mechanical anchoring of the filler material in the leadless module can be obtained by means of the anchoring region, which increases the mechanical robustness of the package.

In various exemplary aspects, the anchoring region can be open toward a top side of the leadless module, facilitating an arrangement of the filler material in a gap between the leadless module and a side wall of an opening in which the leadless module is placed. Accordingly, it is possible to avoid an inadvertent arrangement of the filler material on a top side of the module, which guards against an impairment of the functionality, especially in a case where the leadless module is formed as a sensor (e.g., biometric sensor).

In various exemplary aspects, the anchoring region can be formed so that it is not open toward a top side of the leadless module but that the leadless module is formed so that its top side is able to be fitted into an opening so as to leave substantially no gaps. In this case, the filler material can be introduced into the opening before the leadless module, for example, and can be displaced during the assembly of the leadless module until it extends into the anchoring region. The buffer region, which has been increased by means of the anchoring region, may cause an easier attainment of a dose of the filler material for which an escape of excess filler material next to the top side of the leadless module is avoided and provision for guarding against a functional impairment.

Expressed differently, various exemplary aspects provide a package which comprises an electronic leadless module with non-planar side walls (or at least one non-planar side wall) in order to form an undercut for filler material adjacent to the side wall. Consequently, the leadless module and the filler material are mechanically anchored or meshed with one another, increasing the mechanical stability of the package. Further, a thickness of the filler material in the anchoring region is increased, which additionally increases the mechanical stability of the filler material and hence of the package.

BRIEF DESCRIPTION OF THE DRAWINGS

Exemplary aspects of the disclosure are illustrated in the figures and are explained in more detail below.

In the figures:

FIG. 1 shows three different schematic views of a leadless module for use in a package according to various exemplary aspects;

FIG. 6 shows a flowchart of a method for forming a package according to various exemplary aspects; and FIG. 7 shows a flowchart of a method for forming a chip card according to various exemplary aspects.

DETAILED DESCRIPTION

In the following detailed description, reference is made to the accompanying drawings which form part of said description and show, for illustration, specific aspects in which the disclosure can be performed. In this respect, direction terminology, for instance "at the top", "at the bottom", "at the front", "at the rear", "front", "rear", etc., is used with reference to the orientation of the described figure(s). Since components of aspects can be positioned in a number of different orientations, the direction terminology is used for illustration and is not restrictive in any way. It goes without saying that other aspects can be used, and structural or logical changes can be made without departing from the scope of protection of the present disclosure. It goes without saying that the features of the various exemplary aspects described herein can be combined with one another, unless specifically stated otherwise. The following detailed description therefore should not be interpreted in a restrictive sense, and the scope of protection of the present disclosure is defined by the attached claims.

Within the scope of this description, the terms "linked," "connected," and "coupled" are used to describe both a direct and an indirect link, a direct or indirect connection, and direct or indirect coupling. In the figures, identical or similar elements are provided with identical reference signs if expedient.

Figure 1:
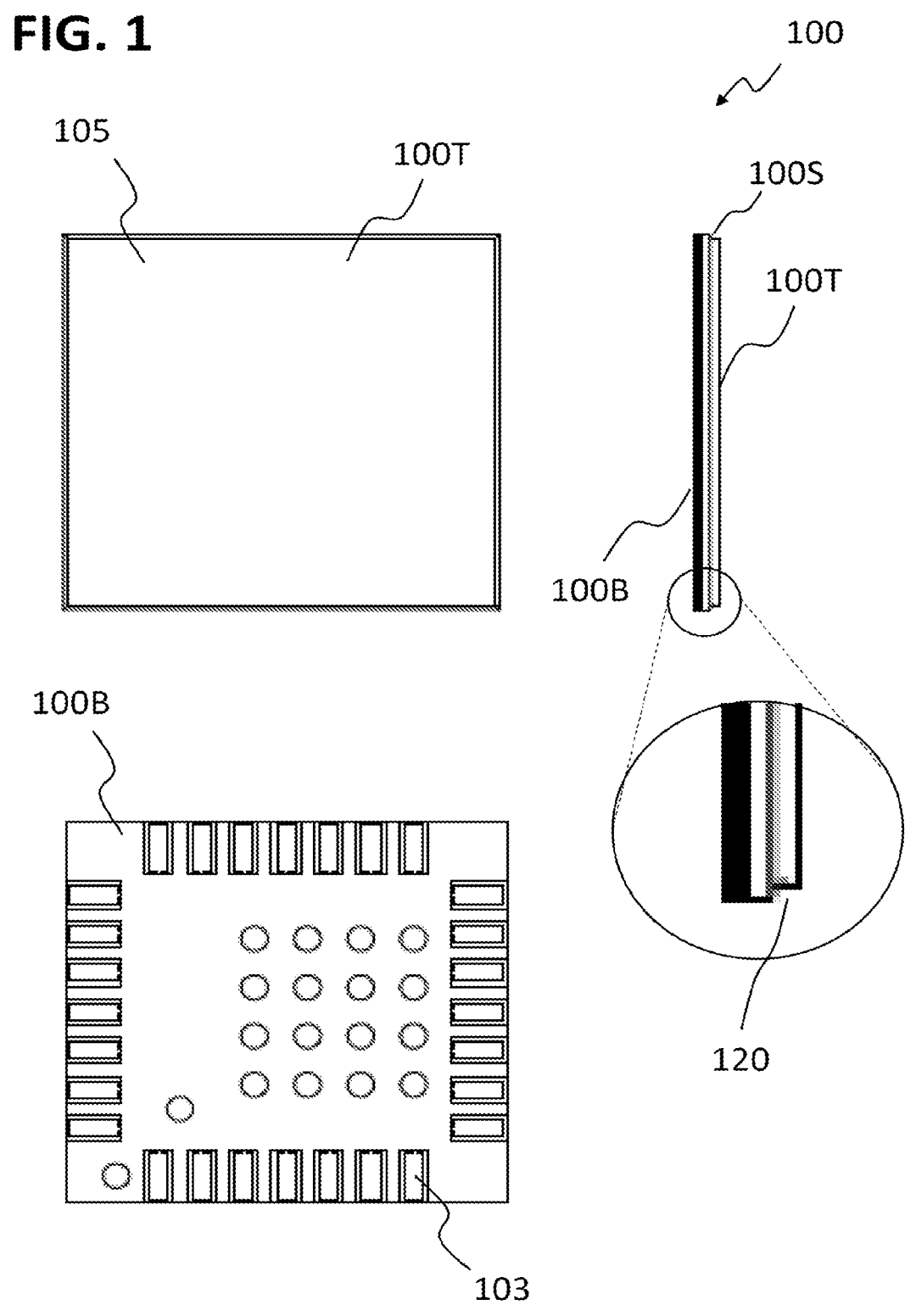
Figure 2:
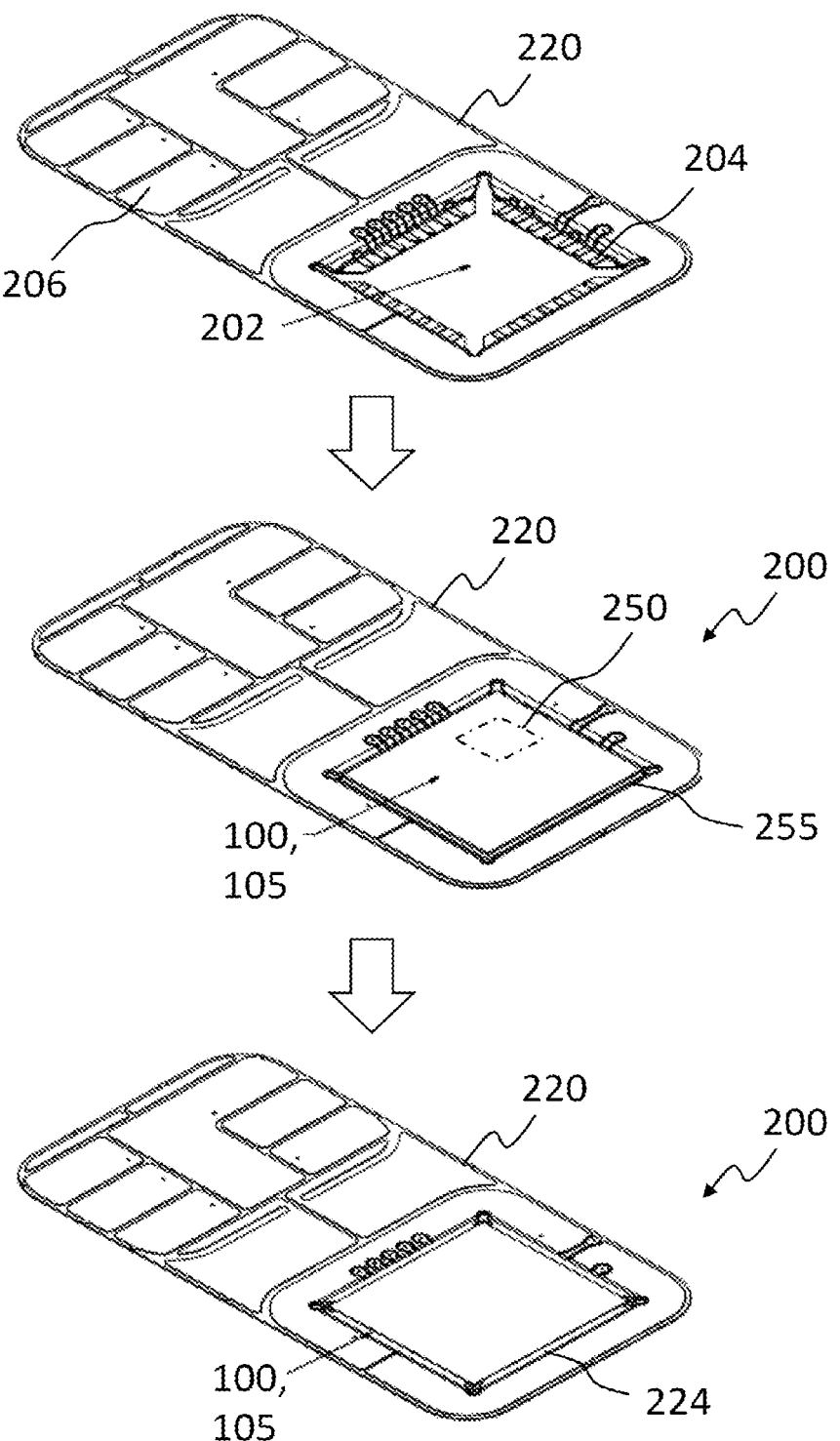
FIG. 2 shows an illustration of a method for forming a package according to various exemplary aspects.
Figures 3A, 3B, 3C, 3D:
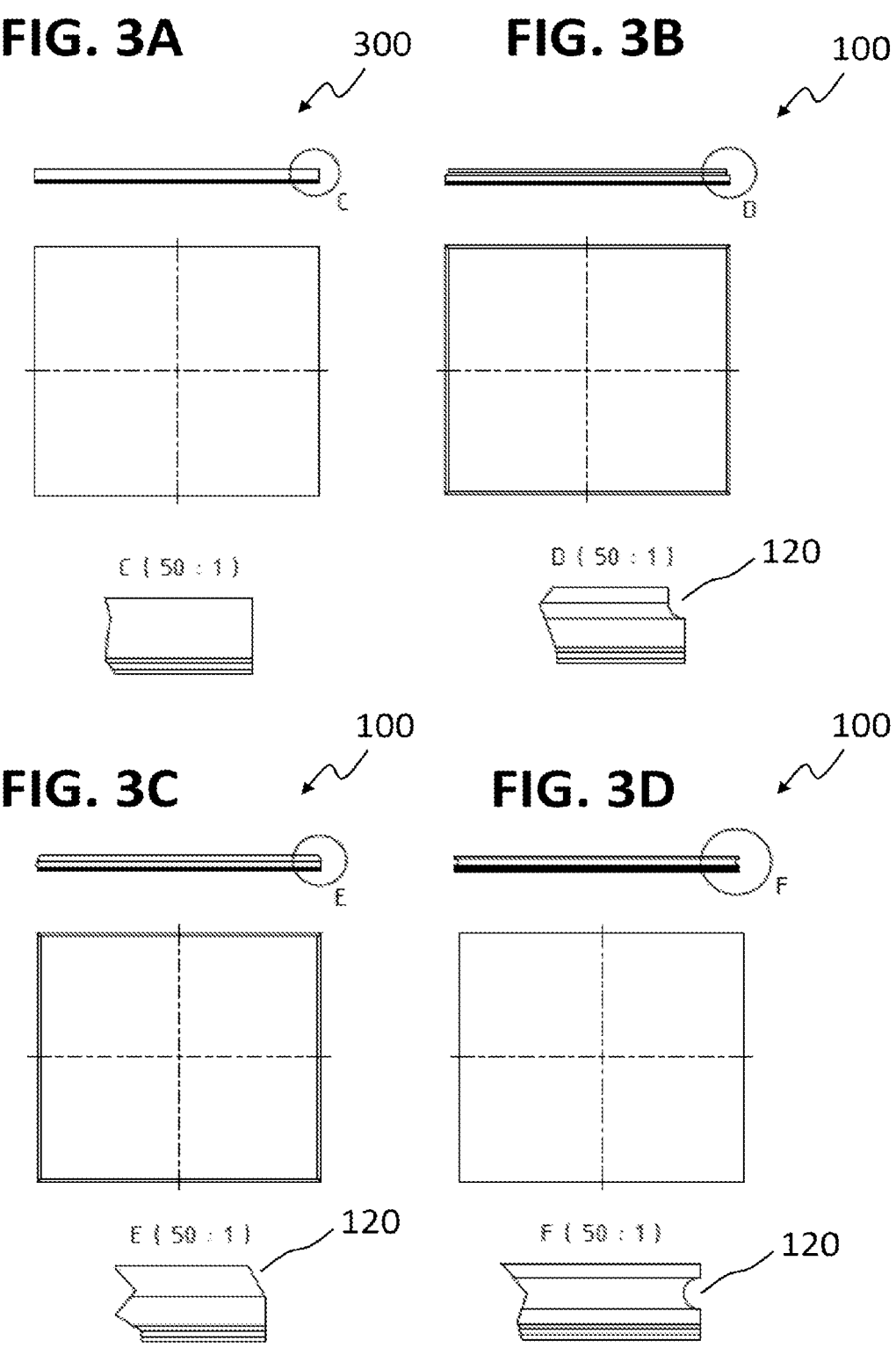
FIG. 3A shows schematic views of an electronic leadless module according to the prior art.
FIGS. 3B, 3C, and 3D each show three schematic views of an electronic leadless module for use in a package according to various exemplary aspects.
Figures 4A, 4B:
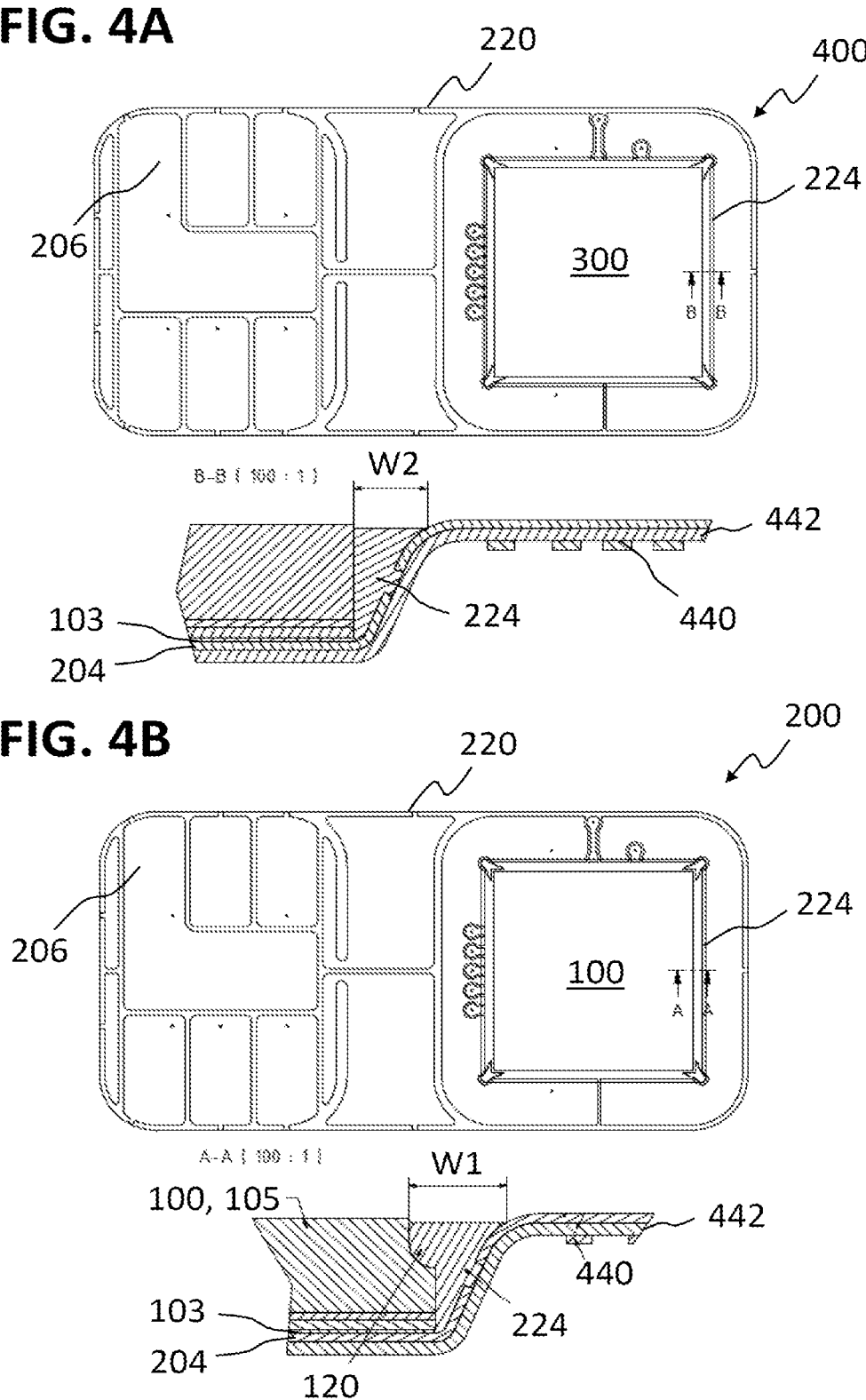
FIG. 4A shows two schematic views of a package according to the prior art.
FIG. 4B shows two schematic views of a package according to various exemplary aspects.

FIG. 1 shows three different schematic views (plan view from above, plan view from below, and side view) of a leadless module 100 for use in a package 200 according to various exemplary aspects. In three individual representations, FIG. 2 shows an illustration of a method for forming a package 200 according to various exemplary aspects. FIGS. 3B, 3C, and 3D each show three schematic views (plan view from above, side view and an enlarged portion of the side view) of an electronic leadless module 100 for use in a package 200 in various exemplary aspects, and FIG. 4B shows two schematic views (plan view and partial cross-sectional view) of a package 200 according to various exemplary aspects.

In various exemplary aspects, the package 200 may comprise an electronic leadless module 100 having a top side 100T, a bottom side 100B and side faces 100S between the top side 100T and the bottom side 100B.

The electronic leadless module 100 may comprise an electronic circuit 250. The electronic circuit 250 is only indicated schematically in FIG. 2B since a person skilled in the art knows how an electronic circuit 250 can be or have been formed in an electronic leadless module 100. To design the leadless module 100 as a sensor module, the electronic circuit 250 may for example comprise circuitry components for operating the sensor and for transmitting data from and to the sensor. As an alternative or in addition, the electronic leadless module 100 may be provided with a different typical functionality and the electronic circuit 250 may be designed accordingly.

The electronic leadless module 100 may comprise a plurality of electrical contact pads 103 at the bottom side 100B of the electronic leadless module 100 which are electrically conductively coupled to the electronic circuit 250.

The electronic leadless module 100 may further comprise encapsulation material 105, which partially encapsulates the electronic circuit 250. The encapsulation material 105 may be arranged according to requirements and substantially in a manner known from the prior art, for example on a top side 100T of the leadless module, for example for protecting a sensor area, on the side faces 100S and/or on a bottom side 100B, with the electrical contact pads 103 being able to be at least partially free from the encapsulation material 105.

Typical designs of leadless modules are, for example, a land grid array (LGA) module, a ball grid array (BGA) module and a quad-flat no-lead (QFN) module.

Typically, what is known as a matrix molding process is used when encapsulating module components with the encapsulation material 105. In the process, the module components are arranged in a matrix form on a common substrate (e.g., as a 10×10 matrix) and are encapsulated together, that is to say provided with a common continuous layer of the encapsulation material 105. In this document, such an arrangement is referred to as a multi-module grouping.

Singulation processes, as are also known in a similar form from wafer processing, are used for separation purposes, for example sawing, laser processing, breaking or a combination of these processes.

The electronic leadless module 100 may have an anchoring region 120 on at least one side face 100S, the design and function of the anchoring region is explained in more detail below.

In various exemplary aspects, the anchoring region 120 can be formed during singulation, for example by way of a two-stage sawing process, for example by starting with a wide saw blade up to for example approximately the half way point of the wafer thickness, followed by sawing with a thin saw blade to completely separate the modules so that the difference in thickness between the thin saw blade and the thick saw blade forms the anchoring region 120 as a cutout (open to the top side), or by means of a combination of sawing and laser separation, or the like. In FIG. 4B, the width of the gap between the module 100 and the carrier frame 220, which width has been increased by the cutout open to the top side 100T, is denoted by W1 (see, for comparison purposes, the gap width W2 in the representation of the prior art in FIG. 4A). A saw blade with a V-shaped cross section can be used to form inclined side walls 100S which do not extend perpendicular to the top or bottom side but instead have a greater distance from a central region of the leadless module 100 at a bottom side of the leadless module 100 than at a top side of the leadless module 100. An exemplary aspect with an inclined side wall section as anchoring region 120 is depicted in FIG. 3C. In various exemplary aspects, the inclined region may extend from the top side 100T to the bottom side 100B of the leadless module 100.

An etching process can be used for the singulation in various exemplary aspects. Depending on the choice of a mask material, an etching means and further etching parameters, for example etching duration, it is possible therewith to obtain back-etching, that is to say a formation of the anchoring region 120 which is not open toward the top side 100T but only or substantially only toward the side (pointing away from the side face 100S), or an anchoring region 120 that is open toward the top side 100T.

In various exemplary aspects, the anchoring region 120 can be formed post-singulation as a process carried out on an individual leadless module 100, for example by means of processing of the side face 100S, for example mechanically or by means of a laser. However, such a process is typically expensive.

Figure 5:
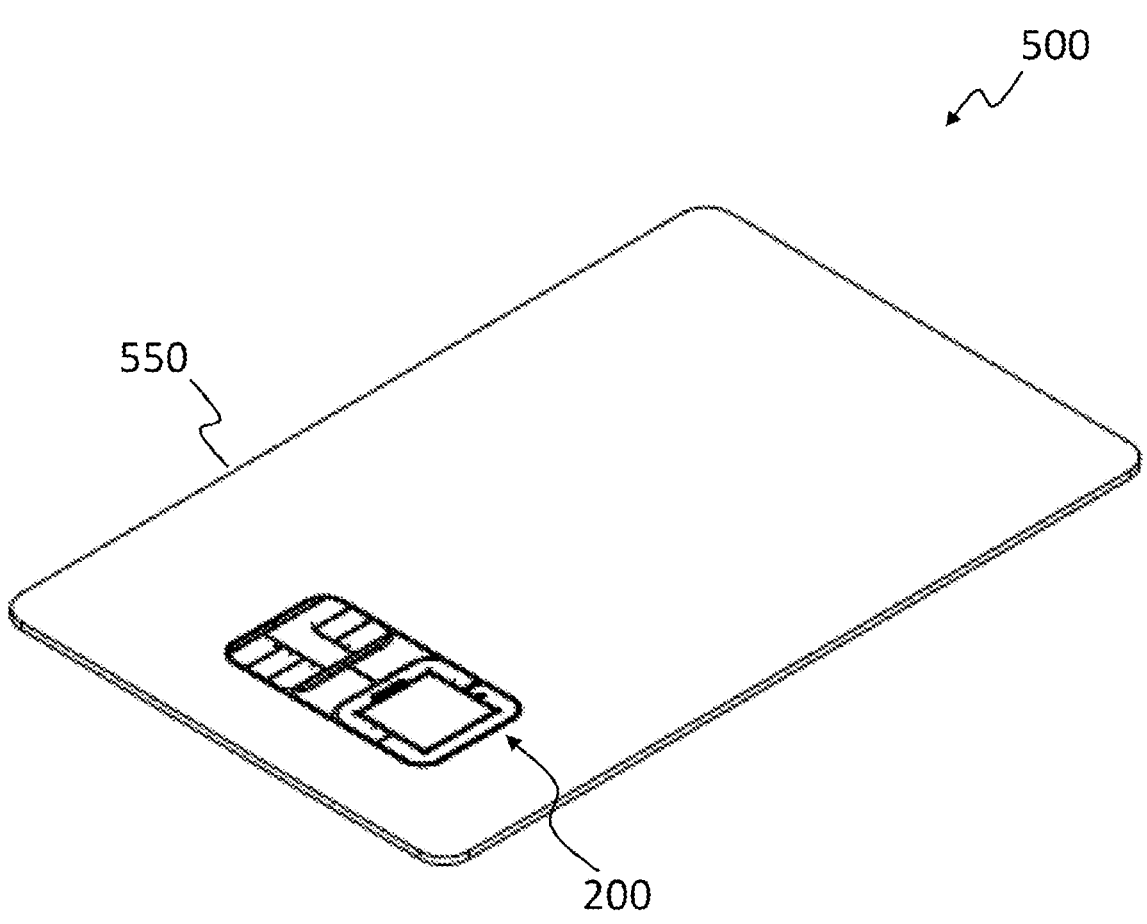
FIG. 5 shows a schematic representation of a chip card according to various exemplary aspects.

The package 200 may further comprise a carrier frame 220 which carries the electronic leadless module 100. An electrically conductive connection between the electrical contact pads 103 of the leadless module 100 and corresponding contacts 204 of the carrier frame 220 can be established while the leadless module 100 is introduced into the carrier frame 220. This can be seen in FIG. 4. A carrier frame 220 which comprises contact areas 206 for contact-based communication with the electronic circuit is depicted in FIG. 2 in exemplary fashion. Antenna turns 440 for contactless communication are additionally depicted in FIG. 4B. In general, the package 200 may be designed for any expedient use, in particular for use in a chip card 500 (see FIG. 5) and the types of use known in the context thereof, that is to say as a contact-based module, contactless module or as a dual-interface module.

The package 200 may further comprise filler material 224 in the anchoring region 120 for fastening the electronic leadless module 100 to the carrier frame 220. The filler material 224 can partially or completely fill the anchoring region 120.

In various exemplary aspects, the filler material 224 can be a filler material 224 known substantially from the prior art, for example what is known as an underfill material or a printable paste which may initially be viscous and may subsequently cure or be cured, for example a resin, for example an epoxy resin. By way of example, the filler material 224 may be introduced or may have been introduced into a gap 255 between the leadless module 100, already in the opening, and the carrier frame 220 by means of a filling or printing apparatus, or may be arranged in the opening 202 (the base of which may be closed in this case) prior to the leadless module 100. A thixotropic filler material 224, which does not independently flow away post arrangement, may be used in the case of an open base of the opening 202. In the process, the filler material 224 can be placed so that it preferably flows in the direction of the side walls 100S and not in the direction of the open base when the leadless module 100 is introduced.

FIGS. 3B to 3D illustrate various designs of the anchoring region 120.

The anchoring region 120 should be open toward the top side 100T of the leadless module 100 or should be arranged in a mid-region of the side face, but it should not be open downwardly so that the mechanical anchoring of the leadless module 100 can be brought about by means of the filler material 224 arranged in the anchoring region 120.

The anchoring region 120 can be formed on one, more or all side faces 100S of the leadless module 100.

In a direction from the top side 100T to the bottom side 100B, a shape of the anchoring region 120 can be formed to be linear (as in FIG. 3C, for example), polygonal, curved (e.g., as a circular segment, for example semicircular like in FIG. 3D) or as a combination thereof (as in FIG. 3B, for example), substantially in any expedient shape.

In various exemplary aspects, the anchoring region 120 may extend (e.g., parallel to the top or bottom side of the leadless module 100) along the entire side face, for example along a plurality of side faces (e.g., two opposing side faces) or for example along all side faces 1005. However, in principle, an anchoring region 120 only formed on a part of the side face 1005 also already brings about improved anchoring of the leadless module 100 on the carrier frame 220.

A height of the anchoring region 120 may be between approximately 5% and approximately 95% of the height of the leadless module 100, for example between approximately 20% and approximately 70%, for example approximately 50%, in various exemplary aspects, depending on requirements.

A depth of the anchoring region 120 may likewise be designed taking account of the design of the leadless module 100; for example, it may be necessary to design the cutout

120 to be flat if the integrated circuit 250 extends very far in the direction of the side face 100S, in order to avoid damage to the integrated circuit 250.

FIG. 6 shows a flowchart 600 of a method for forming a package according to various exemplary aspects.

The method may include forming an electronic leadless module having a top side, a bottom side and side faces between the top side and the bottom side, an electronic circuit, a plurality of electrical contact pads at the bottom side of the electronic leadless module which are electrically conductively coupled to the electronic circuit, and encapsulation material which partially encapsulates the electronic circuit, the electrical contact pads being at least partially free from encapsulation material (at 610).

The method may further comprise forming an anchoring region on at least one side face of the electronic leadless module (at 620), arranging the electronic leadless module in an opening in a carrier frame (at 630), and arranging filler material in the anchoring region in order to fasten the electronic leadless module to the carrier frame (at 640).

FIG. 7 is a flowchart 700 of a method for forming a chip card according to various exemplary aspects.

The method may include providing a chip card body with a receiving opening (at 710) and arranging a package 200 according to an exemplary aspect in the receiving opening (at 720).

Some exemplary aspects are stated in summary below.

Exemplary aspect 1 is a package. The package may comprise an electronic leadless module having a top side, a bottom side and side faces between the top side and the bottom side, the electronic leadless module comprising an electronic circuit, a plurality of electrical contact pads at the bottom side of the electronic leadless module which are electrically conductively coupled to the electronic circuit, and encapsulation material which partially encapsulates the electronic circuit, the electrical contact pads being at least partially free from encapsulation material and the electronic leadless module having an anchoring region on at least one side face. The package may further comprise a carrier frame which carries the electronic leadless module and filler material in the anchoring region for fastening the electronic leadless module to the carrier frame.

Exemplary aspect 2 is a package according to exemplary aspect 1, wherein the anchoring region is formed as a cutout or as an upper section of an inclined side face.

Exemplary aspect 3 is a package according to exemplary aspect 1 or 2, wherein the anchoring region is open in the direction of the top side of the electronic leadless module.

Exemplary aspect 4 is a package according to any one of exemplary aspects 1 to 3, wherein the anchoring region extends along the entire side face, for example parallel to the top and/or bottom side of the leadless module.

Exemplary aspect 5 is a package according to any one of exemplary aspects 1 to 4, wherein the at least one side face has a plurality of side faces, each with one anchoring region.

Exemplary aspect 6 is a package according to any one of exemplary aspects 1 to 5, wherein the electronic leadless module has an anchoring region on each side face.

Exemplary aspect 7 is a package according to any one of exemplary aspects 1 to 6, wherein the side face extends linearly, with a plurality of linear sections, curvedly, for example in the form of a circular segment, or with a combination of these profiles, in a direction from the top side to the bottom side in the anchoring region.

Exemplary aspect 8 is a package according to any one of exemplary aspects 1 to 7, wherein the carrier frame has an opening for receiving the electronic leadless module.

Exemplary aspect 9 is a package according to exemplary aspect 8, wherein the electronic leadless module is interlockingly fastened in the opening of the carrier frame.

Exemplary aspect 10 is a package according to any one of exemplary aspects 1 to 9, wherein the filler material contains or consists of an adhesive.

Exemplary aspect 11 is a package according to any one of exemplary aspects 1 to 10, wherein the filler material completely fills the anchoring region.

Exemplary aspect 12 is a package according to any one of exemplary aspects 1 to 11, wherein the bottom side of the electronic leadless module is formed as a land grid array, as a ball grid array or as a quad-flat no-leads package.

Exemplary aspect 13 is a package according to any one of exemplary aspects 1 to 12, wherein the electronic leadless module is configured as a sensor module.

Exemplary aspect 14 is a chip card. The chip card may comprise a chip card body with a receiving opening and a package according to any one of exemplary aspects 1 to 13, the package having been received in the receiving opening.

Exemplary aspect 15 is a method for forming a package. The method may include forming an electronic leadless module having a top side, a bottom side and side faces between the top side and the bottom side, an electronic circuit, a plurality of electrical contact pads at the bottom side of the electronic leadless module which are electrically conductively coupled to the electronic circuit, and encapsulation material which partially encapsulates the electronic circuit, the electrical contact pads being at least partially free from encapsulation material. The method may further comprise forming an anchoring region on at least one side face of the electronic leadless module, arranging the electronic leadless module in an opening in a carrier frame, and arranging filler material in the anchoring region in order to fasten the electronic leadless module to the carrier frame.

Exemplary aspect 16 is a method according to exemplary aspect 15, wherein the formation of the anchoring region includes forming a cutout or forming an inclined side face, which is inclined so that it is closer to a central region of the leadless module in the upper region than in the lower region.

Exemplary aspect 17 is a method according to exemplary aspect 15 or 16, wherein the anchoring region is open in the direction of the top side of the electronic leadless module.

Exemplary aspect 18 is a method according to any one of exemplary aspects 15 to 17, wherein the anchoring region extends along the entire side face.

Exemplary aspect 19 is a method according to any one of exemplary aspects 15 to 18, wherein the at least one side face has a plurality of side faces, each with one anchoring region.

Exemplary aspect 20 is a method according to any one of exemplary aspects 15 to 19, wherein the electronic leadless module has an anchoring region on each side face.

Exemplary aspect 21 is a method according to any one of exemplary aspects 15 to 20, wherein the side face extends linearly, with a plurality of linear sections, curvedly, for example in the form of a circular segment, or with a combination of these profiles, in a direction from the top side to the bottom side in the anchoring region.

Exemplary aspect 22 is a method according to any one of exemplary aspects 15 to 21, wherein the anchoring region is formed in the multi-module grouping.

Exemplary aspect 23 is a method according to any one of exemplary aspects 15 to 22, wherein the anchoring region is formed while the electronic leadless modules are singulated from a multi-module grouping.

Exemplary aspect 24 is a method according to exemplary aspect 22 or 23, wherein the forming of the anchoring region includes sawing for the purposes of forming the anchoring region and sawing with a thinner saw blade or breaking for the purposes of separating the multi-module grouping below and/or above the anchoring region.

Exemplary aspect 25 is a method according to any one of exemplary aspects 15 to 24, wherein the anchoring region is formed after the electronic leadless modules have been singulated from a multi-module grouping.

Exemplary aspect 26 is a method according to any one of exemplary aspects 15 to 25, wherein the forming includes at least one method from a group of methods, the group including sawing, grinding, laser processing, and etching.

Exemplary aspect 27 is a method according to any one of exemplary aspects 15 to 26, further including: arranging the electronic leadless module in an opening in the carrier frame.

Exemplary aspect 28 is a method according to exemplary aspect 27, further including interlockingly fastening the electronic leadless module in the opening of the carrier frame.

Exemplary aspect 29 is a method according to any one of exemplary aspects 15 to 28, wherein the filler material contains or consists of an adhesive.

Exemplary aspect 30 is a method according to any one of exemplary aspects 15 to 29, wherein the filler material completely fills the anchoring region.

Exemplary aspect 31 is a method according to any one of exemplary aspects 27 to 30, wherein the filler material is arranged in the anchoring region post arrangement of the electronic leadless module.

Exemplary aspect 32 is a method according to any one of exemplary aspects 27 to 30, wherein the filler material is arranged in the opening prior to the arrangement of the electronic leadless module and fills the anchoring region post arrangement of the electronic leadless module.

Exemplary aspect 33 is a method according to any one of exemplary aspects 15 to 32, wherein the bottom side of the electronic leadless module is formed as a land grid array, as a ball grid array or as a quad-flat no-leads package.

Exemplary aspect 34 is a method according to any one of exemplary aspects 15 to 33, wherein the electronic leadless module is configured as a sensor module.

Exemplary aspect 35 is a method for forming a chip card. The method may include providing a chip card body with a receiving opening and arranging a package according to any one of exemplary aspects 1 to 13 in the receiving opening.

Further advantageous configurations of the device emerge from the description of the method and vice versa.

The invention claimed is:

1. A package, comprising:
   an electronic leadless module having a top surface, a bottom surface, and side surfaces between the top surface and the bottom surface, the electronic leadless module comprising:
   an electronic circuit;
   a plurality of electrical contact pads at the bottom surface of the electronic leadless module, which are electrically conductively coupled to the electronic circuit; and
   an encapsulation material which partially encapsulates the electronic circuit, the electrical contact pads being at least partially free from encapsulation material; and a carrier frame configured to carry the electronic leadless module, the bottom surface of which faces the carrier frame, wherein at least one of the side surfaces of the electronic leadless module is contoured to form an anchoring region configured to receive filler material for fastening the electronic leadless module to the carrier frame.

2. The package of claim 1,
wherein the anchoring region is formed as a cutout or as an upper section of an inclined side surface.

3. The package of claim 1,
wherein the anchoring region is open in a direction of the top surface of the electronic leadless module.

4. The package of claim 1,
wherein the anchoring region extends along an entire side surface.

5. The package of claim 1,
wherein a plurality of side surfaces each have an anchoring region.

6. The package of claim 1,
wherein the electronic leadless module has an anchoring region on each side surface.

7. The package of claim 1,
wherein the side surface extends linearly, with a plurality of linear sections, curvedly, in a form of a circular segment, or with a combination of these profiles, in a direction from the top surface to the bottom surface in the anchoring region.

8. The package of claim 1,
wherein the carrier frame has an opening for receiving the electronic leadless module.

9. The package of claim 8,
wherein the electronic leadless module is interlockingly fastened in the opening of the carrier frame.

10. The package of claim 1,
wherein the filler material completely fills the anchoring region.

11. The package of claim 1,
wherein the bottom surface of the electronic leadless module is formed as a land grid array, as a ball grid array, or as a quad-flat no-leads package.

12. The package of claim 1,
wherein the electronic leadless module is configured as a sensor module.

13. A chip card, comprising:
a chip card body with a receiving opening; and the package of claim 1, the package having been received in the receiving opening.

14. A method for forming a package, the method comprising:
forming an electronic leadless module having a top surface, a bottom surface, and side surfaces between the top surface and the bottom surface, an electronic circuit, a plurality of electrical contact pads at the bottom surface of the electronic leadless module which are electrically conductively coupled to the electronic circuit, and encapsulation material which partially encapsulates the electronic circuit, wherein the electrical contact pads are at least partially free from encapsulation material;

contouring at least one of the side surfaces of the electronic leadless module to form an anchoring region configured to receive filler material for fastening the electronic leadless module to a carrier frame;

arranging the electronic leadless module in an opening in a carrier frame with the bottom surface of the electronic leadless module facing the carrier frame; and arranging filler material in the anchoring region to fasten the electronic leadless module to the carrier frame.

15. The method of claim 14,
wherein the anchoring region is formed as a cutout and in a multi-module grouping.

16. The method of claim 14,
wherein the anchoring region is formed while the electronic leadless modules are singulated from a multi-module grouping.

17. The method of claim 15,
wherein the forming of the anchoring region includes sawing to form the anchoring region and sawing with a thinner saw blade or breaking to separate the multi-module grouping below and/or above the cutout.

18. The method of claim 14,
wherein the anchoring region is formed after the electronic leadless modules have been singulated from a multi-module grouping.

19. The method of claim 14,
wherein the forming of the anchoring region includes at least one method from a group of methods consisting of: sawing; grinding; laser processing; and etching.

20. A method for forming a chip card, the method comprising:
providing a chip card body with a receiving opening; and
arranging the package of claim 1 in the receiving opening.

* * * * *